(12) United States Patent
Schnizler (10) Patent No.: US 10,574,434 B1
(45) Date of Patent: Feb. 25, 2020

(54) SLIP DETECTION ON HIGH SPEED DATA LINKS

(71) Applicant: VIAVI SOLUTIONS INC., San Jose, CA (US)

(72) Inventor: Reiner Schnizler, Eningen Unter Achalm (DE)

(73) Assignee: VIAVI SOLUTIONS INC., San Jose, CA (US)

( * ) Notice: Subject to any disclaimer, the term of this patent is extended or adjusted under 35 U.S.C. 154(b) by 0 days.

(21) Appl. No.: 16/392,232

(22) Filed: Apr. 23, 2019

(51) Int. Cl.
*H04B 3/46* (2015.01)
*H04L 7/00* (2006.01)

(52) U.S. Cl.
CPC .................................. *H04L 7/0054* (2013.01)

(58) Field of Classification Search
CPC ...................................................... H04L 7/0054
See application file for complete search history.

(56) References Cited

U.S. PATENT DOCUMENTS

2006/0133468 A1\* 6/2006 Chen .................. H04B 17/0085
375/224
2018/0091335 A1\* 3/2018 Schnizler ............ H04L 25/4917

\* cited by examiner

*Primary Examiner* — Dhaval V Patel
(74) *Attorney, Agent, or Firm* — Mannava & Kang, P.C.

(57) ABSTRACT

The disclosure relates to detecting phase slips in a data link. An apparatus may perform a frame resynchronization when a phase slip is detected. The apparatus may generate a reference phase signal that is compared to incoming data frames to determine whether a phase slip occurred and characterize the phase slip. The counter may be based on a recovered receiver clock, thereby counting an actual number of bits received, and may wrap based on the frame size. A value of the counter latched to an incoming frame before the frame resynchronization may be compared to a latched value of the counter after the frame resynchronization to determine whether a phase slip, a size of the phase slip, and a direction of the phase slip.

20 Claims, 8 Drawing Sheets

Generate parallel reference phase bit counter values based on respective bit positions of incoming words on the parallel data link, the incoming words each having a fixed word size, wherein each parallel reference phase bit counter value is generated based on a current word count of a current word, a current position of a bit within the current word, and the fixed word size
502

Latch a respective one of the reference phase bit counter values with each incoming data frame so that the RPBC values are associated with a frame event of each incoming data frame
504

Determine whether a phase slip has occurred on the parallel data link based on a first latched value and a second latched value
506

SLIP DETECTION ON HIGH SPEED DATA LINKS

BACKGROUND

Phase slips are an increasing problem with high speed serial data links. The higher the bitrates, the more prone the links are to suffer from phase slip problems. Slips may be caused by the clock and data recovery units (CDRs) having to work with lower and lower signal-to-amplitude and signal-to-phase noise margins.

Currently, reliably detecting and analyzing phase slips occurring on high speed data links is difficult because even though a data error resulting from phase slips are detectable, there may be several possible causes of the data errors. As such, testing and diagnosis tools may mischaracterize the true cause of the data error. For example, slips are oftentimes mischaracterized as error bursts. This can be misleading since the root causes for error bursts are very different from the root causes for phase slips in many cases. The problem is often exacerbated by the errors occurring infrequently (such as only once a day) and because slips may be dependent on the specific data pattern being processed. Therefore, diagnosing and fixing slip induced errors is often difficult and time consuming.

BRIEF DESCRIPTION OF DRAWINGS

Features of the present disclosure are illustrated by way of examples shown in the following figures. In the following figures, like numerals indicate like elements, in which.

DETAILED DESCRIPTION

The disclosure relates to detecting phase slips that may occur in data links that use framed signals having a fixed frame period. A phase slip as used herein may include a forward slip in which bits are gained in a data frame or a reverse slip in which bits are lost in a data frame. Phase slips may occur due to a number of reasons, such as bits being read too fast or too slow in a given data frame. Phase slips may result in frame alignment problems.

When a phase slip occurs at a receiver, the receiver may detect such phase slip as a data error and employ a frame synchronization state machine (FSSM) that performs a resynchronization on the data link, which may resynchronize a non-synchronized data frame. To do so, the FSSM may use explicit frame delineation markers or an implicit frame delineation mechanism (such as by checking the result of a checksum of incoming data). For multilane interfaces, the FSSM may use alignment markers used for lane deskew. In some examples, the FSSM may resynchronize frames, correcting any phase slips that may have occurred whether or not errors were detected. In some of these examples, an apparatus disclosed herein may detect and quantify such phase slips for reporting and testing purposes so that phase slips may be minimized.

In whichever manner the FSSM performs the resynchronization, to optimize performance of the data link by minimizing phase slips in the first place, an apparatus such as a test instrument may identify and report an occurrence of phase slips, the size of each phase slip, and a direction of each phase slip. To identify the occurrence of phase slips, the apparatus may include a reference phase bit counter (RPBC) that is driven based on a recovered clock signal such as a recovered receiver clock (Rx Clk). Accordingly, the RPBC may indicate the number of actual bits received through the data link, and not based on synchronization to incoming data frames. In some examples, the RPBC counts from 0 to the frame size−1 and wraps from the frame size to 0. For example, after the RPBC reaches the frame size-1, the RPBC resets to 0.

In some examples, the data link includes a multi-lane data link. In these examples, the apparatus may include a RPBC for each lane in a multi-lane interface. Thus, an apparatus that uses a multi-lane data link may include multiple RPBCs—one for each lane.

In some examples, a value of the RPBC may be latched to incoming frames at regular intervals. In these examples, a latched value of the RPBC may represent the relative phase of an incoming data frame. The latching signal may be synchronized to the phase of an incoming frame even though the RPBC itself does not synchronize to the incoming frames. More generally, a value of the RPBC may be associated with a frame event such as receipt of an leading bit of an incoming frame. To illustrate, a latched value of the RPBC of 1 for a first incoming frame and a latched value of the RPBC of 2 for a second incoming frame may indicate that the first and second frames are relatively out of phase with respect to one another. It should be noted that the RPBC may be latched based on other frame events (such as when one or more other bits of the incoming frame are received).

When the FSSM performs a resynchronization, the apparatus may compare the last latched value of the RPBC before the resynchronization (RPBC_A) to the first latched value of the RPBC after successful resynchronization (RPBC_B). The apparatus may generate a delta value (RPBC_delta) based on RPBC_B and RPBC_A using a signed integer arithmetic operation, which takes into account the wrapping RPBC (in other words, the signed integer arithmetic operation may take into account the frame size). For example, RPBC_delta may be calculated as (RPBC_B−RPBC_A). A slip may be detected if the RPBC_delta value is non-zero. An absolute value of the RPBC_delta value may indicate the size of phase slippage (such as a number of bits that have slipped). A sign of the RPBC_delta value may indicate directionality of the slippage. For example, RPBC_delta values that are greater than zero may indicate forward slippage (gain of bits) while RPBC_delta values that are less than zero may indicate reverse slippage (loss of bits).

In some examples, the data link may include a parallel data link. Each of the parallel data links may transmit words having a word size N. In these examples, the RPBC may include a reference word counter (RWC) that counts each word, and a bit position indicator (BPI) that indicates the position of the frame within the word. The bit position range may be from 0 to (N−1) with bit 0 being the "earliest" bit and bit (N−1) being the "last" bit within a word. The RPBC value for parallel data links may be calculated based on a product of the word size (N) and the reference word counter (RWC) value, summing the product with the BPI value, and accounting for the RPBC wrapping. The RPBC value for parallel data links may be similarly latched and used to determine phase slips as previously described.

Figure 1A:
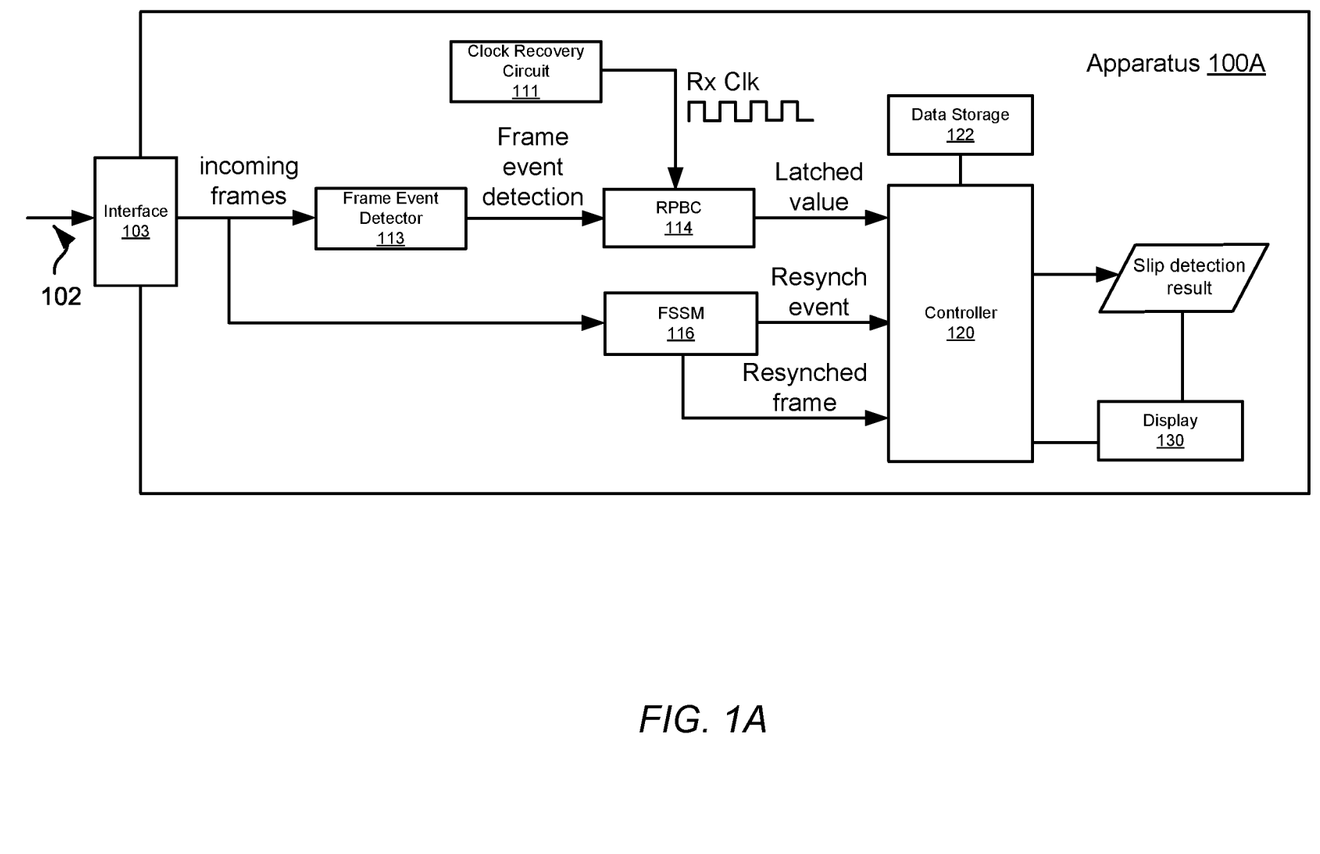
FIG. 1A illustrates an apparatus for detecting phase slips on a data link using a reference phase bit counter, according to an example of the disclosure.

Reference will now be made to the figures to illustrate further examples of detecting phase slips on high speed data links via a RPBC. FIG. 1A illustrates an apparatus 100A for detecting phase slips on a data link 102 using a RPBC 114, according to an example of the disclosure. The data link 102 may include Plesiochronous digital hierarchy links, Digital Signal (DS) DS1/DS2/DS3 links, Synchronous digital hierarchy (SDH)/Sonet links, an Optical Transport Network (OTN) link, Optical Transport Layer (OTL) variants, Ethernet 25G (with Forward Error Correction (FEC)), Ethernet 50G, Ethernet 40G, Ethernet 100G, Ethernet 200G, Ethernet 400G, and/or other links that use framed signals having a fixed frame period. The data link 102 may include framed signals having a fixed size. For example, each incoming frame may have a fixed periodicity.

Figure 1B:
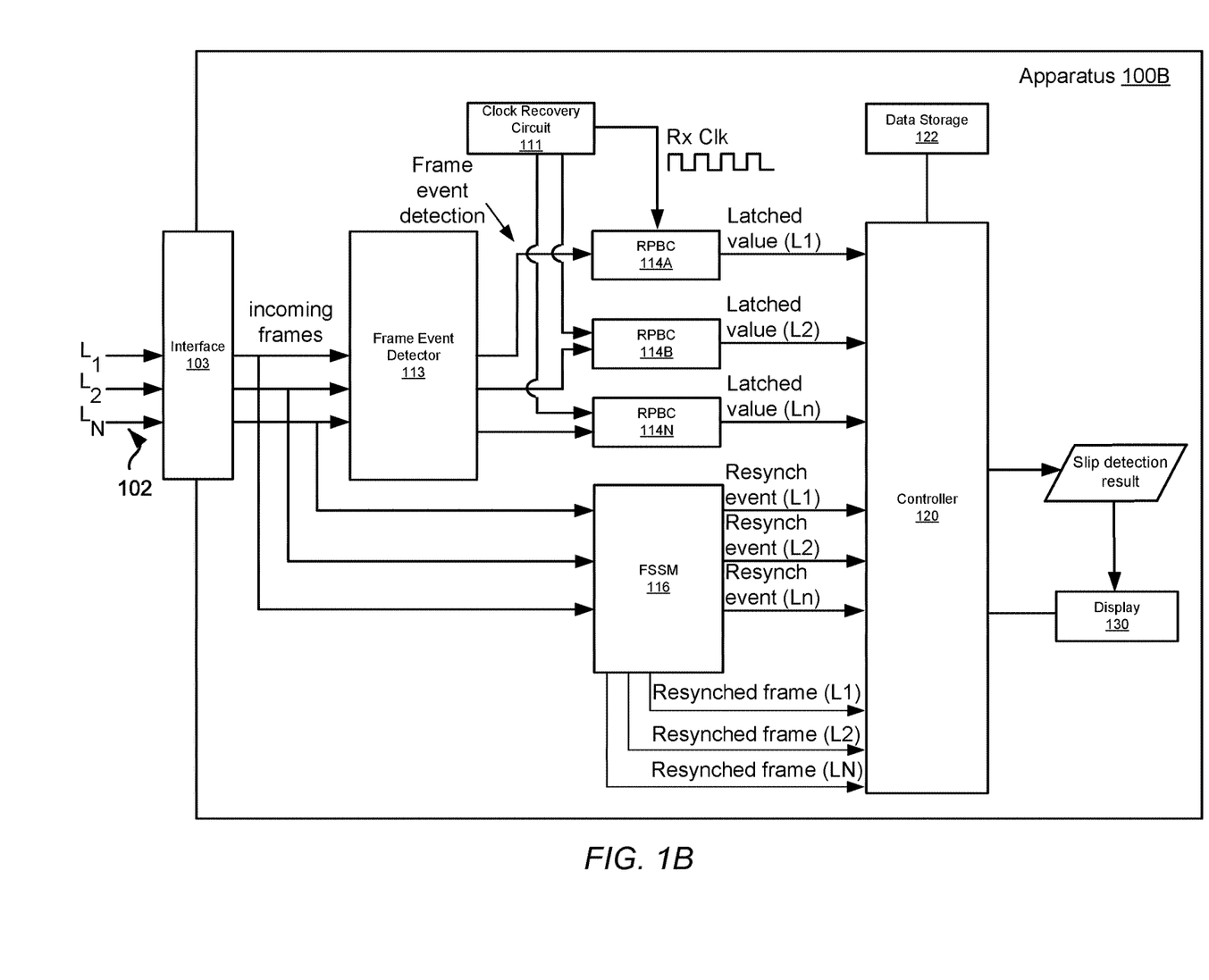
FIG. 1B illustrates an apparatus for detecting phase slips on a multi-lane data link using a reference phase bit counter, according to an example of the disclosure.

In some examples, the data link 102 may include a multi-lane data link having a plurality of lanes (L1-LN). In these examples, the apparatus 100B may include a RPBC (illustrated in FIG. 1B as RPBC 114A-N) for each lane of the multi-lane data link. Each RPBC 114A-N in the multi-lane examples may operate on its respective lane (L1-LN) in the same manner as that described with respect to RPBC 114 illustrated in FIG. 1A. Accordingly, examples illustrated in FIG. 1B may operate similarly to examples described with respect to FIG. 1A, except that the apparatus 100B includes a RPBC 114A-N for each lane L1-N and each lane may be resynchronized as illustrated in FIG. 1B. It should be noted that the controller 110 may generate a slip detection result for each lane L1-LN. Thus, the description that follows will provide examples that refer to apparatus 100 (which can refer to either apparatus 100A or 100B), unless expressly noted otherwise.

Referring to FIGS. 1A and 1B, the apparatus 100 may include various layers, processors, systems or subsystems. For example, the apparatus 100 may include an interface 103, a clock recovery circuit 111, a frame event detector 113, a RPBC 114 (or a plurality of RPBC 114A-N illustrated in FIG. 1B), a FSSM 116, a controller 120, a data storage 122, a display 130, and/or other modules. The interface 103 may include a data port suitable to couple to the data link 102 to receive and transmit data via the data link 102. For example, the data port may include an Ethernet port. The clock recovery circuit 111, frame event detector 113, the RPBC 114, the FSSM 116, and the controller 120 may each be implemented as a semiconductor-based microprocessor, a central processing unit (CPU), an application processor specific integrated circuit (ASIC), a field-programmable gate array (FPGA), and/or other suitable hardware device. It should be noted that each of these components may be incorporated with other components. For example, the RPBC 114 may be integrated with the clock recovery circuit 111 and/or the frame event detector 113. Likewise, the controller 120 may be integrated with the RPBC 114 and/or the FSSM 116.

The data storage 122 may have stored thereon machine-readable instructions (which may also be termed computer readable instructions). In some examples of the apparatus 100, the data storage 122 may store machine-executable instructions that a processor of the apparatus 100 may execute to perform at least some of the operations described herein. The data storage 122 may be an electronic, magnetic, optical, or other physical storage device that includes or stores executable instructions. The data storage 122 may be, for example, Random Access memory (RAM), an Electrically Erasable Programmable Read-Only Memory (EEPROM), a storage device, an optical disc, and the like. The data storage 122 may be a non-transitory machine-readable storage medium, where the term "non-transitory" does not encompass transitory propagating signals.

The display 130 may include a display device through which the slip detection result may be provided. For example, the display 130 may display a graphical user interface, which may be generated by the controller 120, that includes the slip detection result for display via the display 130.

The clock recovery circuit 111 may recover clock signals from the incoming signal of the data link 102 to generate a recovered clock (Rx Clk). High-speed data streams are often sent without an accompanying clock signal. The clock recovery circuit 111 of the receiver, e.g., apparatus 100, may generate Rx Clk from an approximate frequency reference, and then phase-aligns Rx Clk to transitions in the data stream (e.g., incoming bits or symbols in the incoming frames) with a phase-locked loop (PLL). The Rx Clk may drive the RPBC 114 to increment a counter in the RPBC 114. Thus, the RPBC 114 may count incoming bits or symbols of the incoming signal. The RPBC 114 may count from zero and wrap at frame size−1. Thus, the RPBC 114 may reset back to zero once the frame size is reached. The RPBC 114 may increment without being synchronized to an incoming frame. As such, the RPBC 114 may serve as a reference for determining a relative phase of the incoming frames.

In some examples, the RPBC 114 may be latched to incoming frames at various times. For instance, the RPBC 114 may be latched to incoming frames responsive to a frame event detection from the frame event detector 113. The frame event detector 113 may detect frame events based on incoming frames of the data link 102. A frame event may include receipt of a leading bit of a frame (such as via detection of a header field), receipt of an end of frame (such as via detection of a trailer field), and/or other event associated with an incoming frame of data of the data link 102. Upon frame event detection, the RPBC 114 may provide latched values to the controller 120. The controller 120 may store the latched values in a memory, such as data storage 122.

The FSSM 116 may perform a resynchronization (resynch event) based on explicit or implicit resynch markers. Such resynchronization may correct any synchronization errors, but may not quantify or indicate occurrence of such errors. When a resynchronization occurs, the FSSM 116 may provide an indication of the resynch event (but not necessarily an indication of occurrence of a phase slip) to the controller 120. Responsive to the indication of the resynch event, the controller 120 may determine a latched value of the RPBC 114 before the resynch event and a latched value after the resync event. For example, the controller 120 may access the latched values from the data storage 122 received before and after the resynch event occurred. The controller 120 may compare the latched values before and after the resynch event to generate a slip detection result. The slip detection result may include a determination of whether a phase slip occurred, a size of the phase slip, a direction of the phase slip, and/or other information relating to the phase slip.

Figure 2:
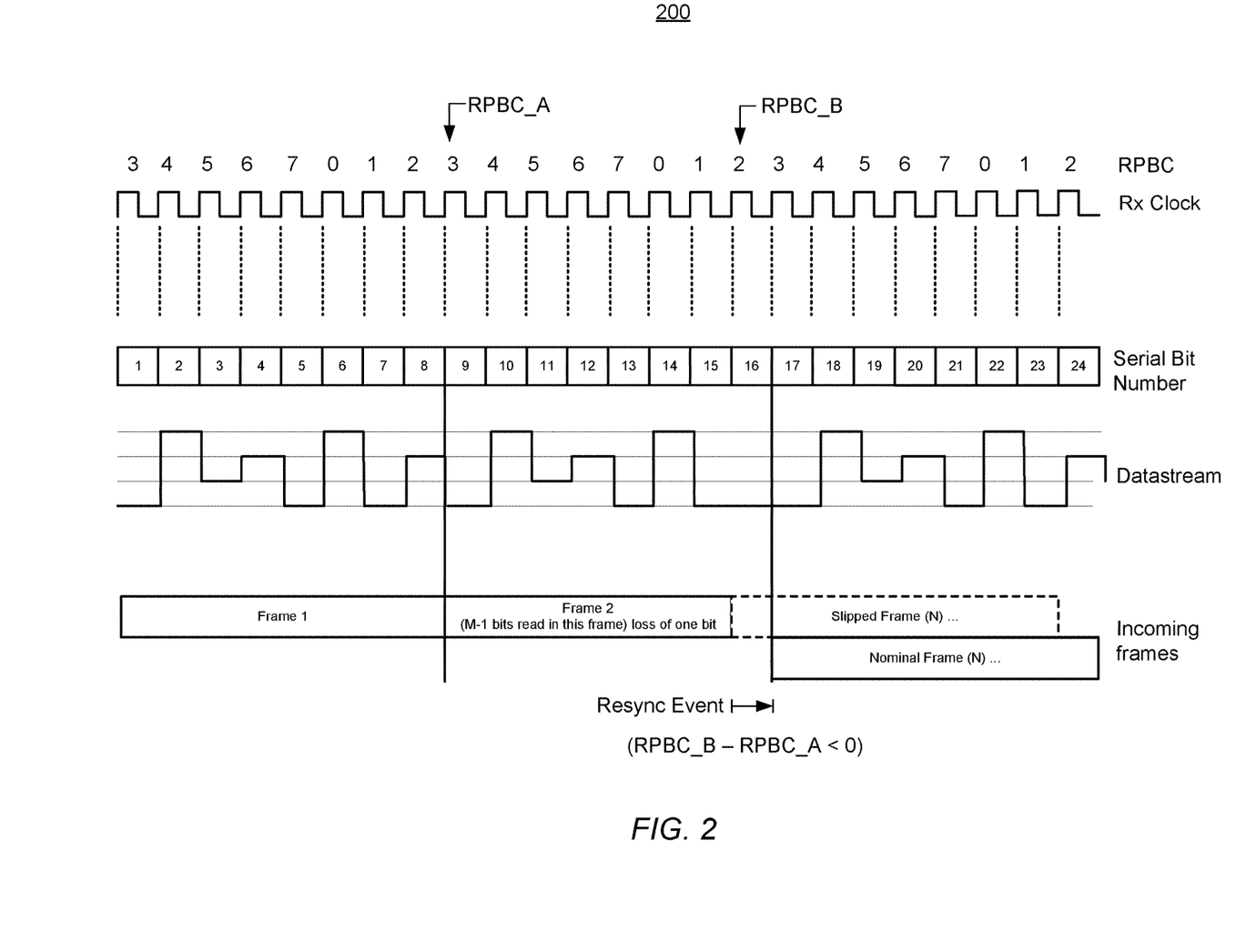
FIG. 2 illustrates detection of reverse phase slips on a data link, according to an example of the disclosure.

Operations of the apparatus 100 to generate the slip detection result will be described with reference to FIGS. 2 and 3. Referring to FIG. 2, the FSSM 116 may perform a resynchronization of a frame of the data link 102. For example, in some examples, one or more alignment markers may be provided on a periodic basis (at regular time intervals and/or bit intervals) on each lane. These alignment markers may enable alignment of the data in the lanes to be deskewed based on the fixed timing/bit intervals. Alternatively, the FSSM 116 may resynchronize the frames based on implicit markers such as through Cyclic Redundancy Check (CRC) hash values used to detect out of phase frames.

Because the RPBC 114 may be latched to each incoming frame (Frames 1-N), the RPBC 114 may analyze the latched values before and after the resynch to determine whether a phase slip occurred, the size of the phase slip, and/or direction of the phase slip.

Figure 3:
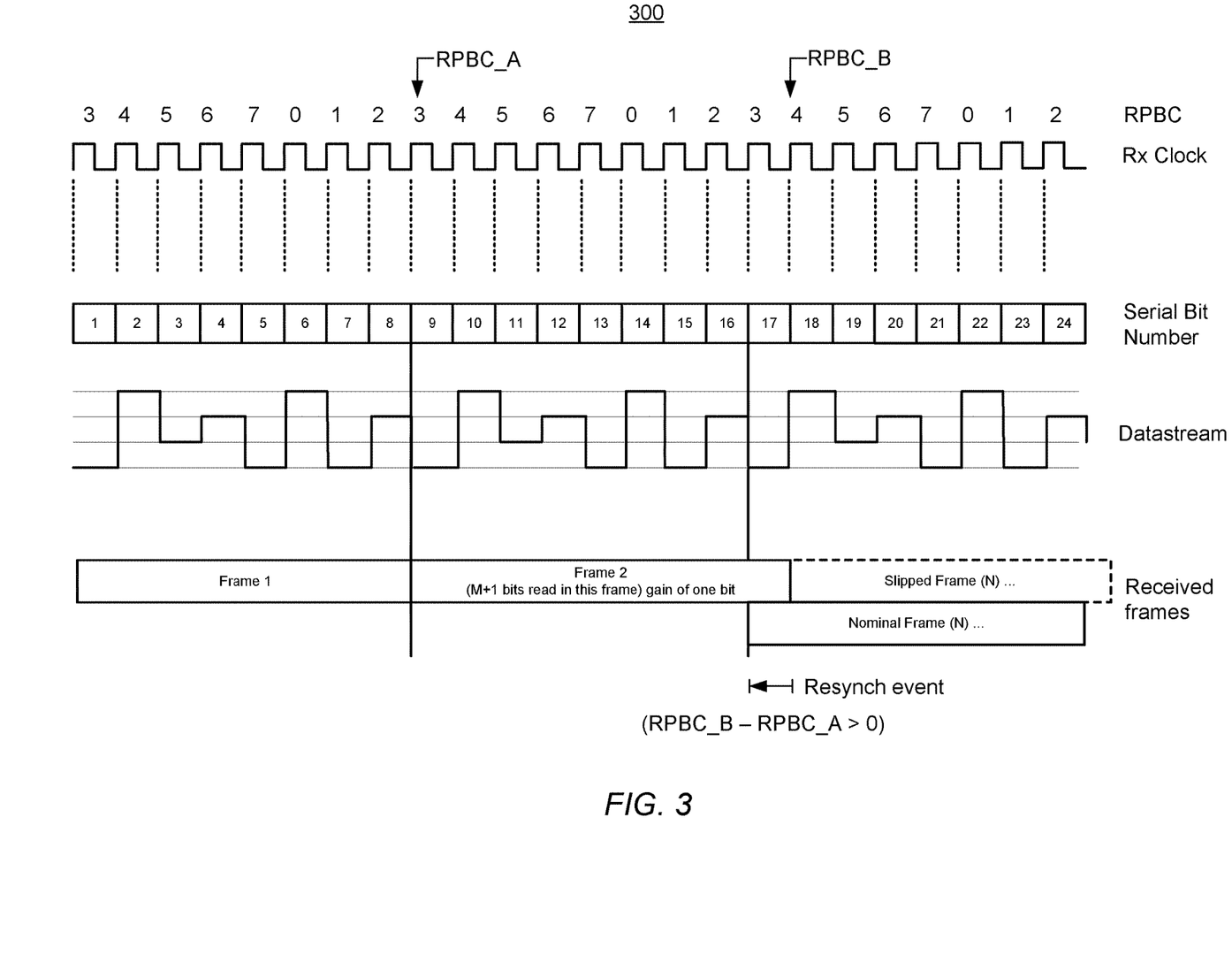
FIG. 3 illustrates detection of forward phase slips on a serial data link, according to an example of the disclosure.

FIG. 2 illustrates a latched reference counter for detecting reverse phase slips on a data link (such as data link 102 illustrated in FIGS. 1A and 1B) and FIG. 3 illustrates a latched reference counter for detecting forward phase slips on the data link, according to an example of the disclosure.

FIGS. 2 and 3 are each illustrated with three frames (Frames 1, 2, N) each having a fixed frame size (M). M=8 bits is shown for illustrative clarity but other fixed frame sizes may be used. Furthermore, although the type of datastream received is illustrated as using 4-level Pulse Amplitude Modulation (PAM-4) signaling, other types of signaling may be used as well. Although the RPBC as illustrated wraps to zero at bit number 6 of the frame, the RPBC may wrap at other portions of a frame instead.

The FSSM 116 may perform a resynchronization (illustrated as "Resynch event") of a frame of the data link (such as data link 102 illustrated in FIGS. 1A and 1B). Referring to FIG. 2, Frame 2 has lost one bit because M−1 bits were read in Frame 2 instead of M bits. The result is that the next incoming frame (Frame N) will slip by one bit. Re-synch may cause the slipped frame N to be resynchronized as illustrated by the slipped Frame (N). Application of a signed integer arithmetic operation in this scenario may yield RPBC_B−RPBC_A<0, indicating a loss of bit(s). The nominal frame (N) shows a hypothetical frame if no slippage occurred.

Referring to FIG. 3, Frame 2 has gained one bit because M+1 bits were read in Frame 2 instead of M bits. The result is that the next incoming frame (Frame N) will slip by one bit. Re-synch may cause the slipped frame N to be resynchronized as illustrated by the slipped Frame (N). Application of a signed integer arithmetic operation in this scenario may yield RPBC_B−RPBC_A>0, indicating a gain of bit(s). The nominal frame (N) shows a hypothetical frame if no slippage occurred.

Figure 4:
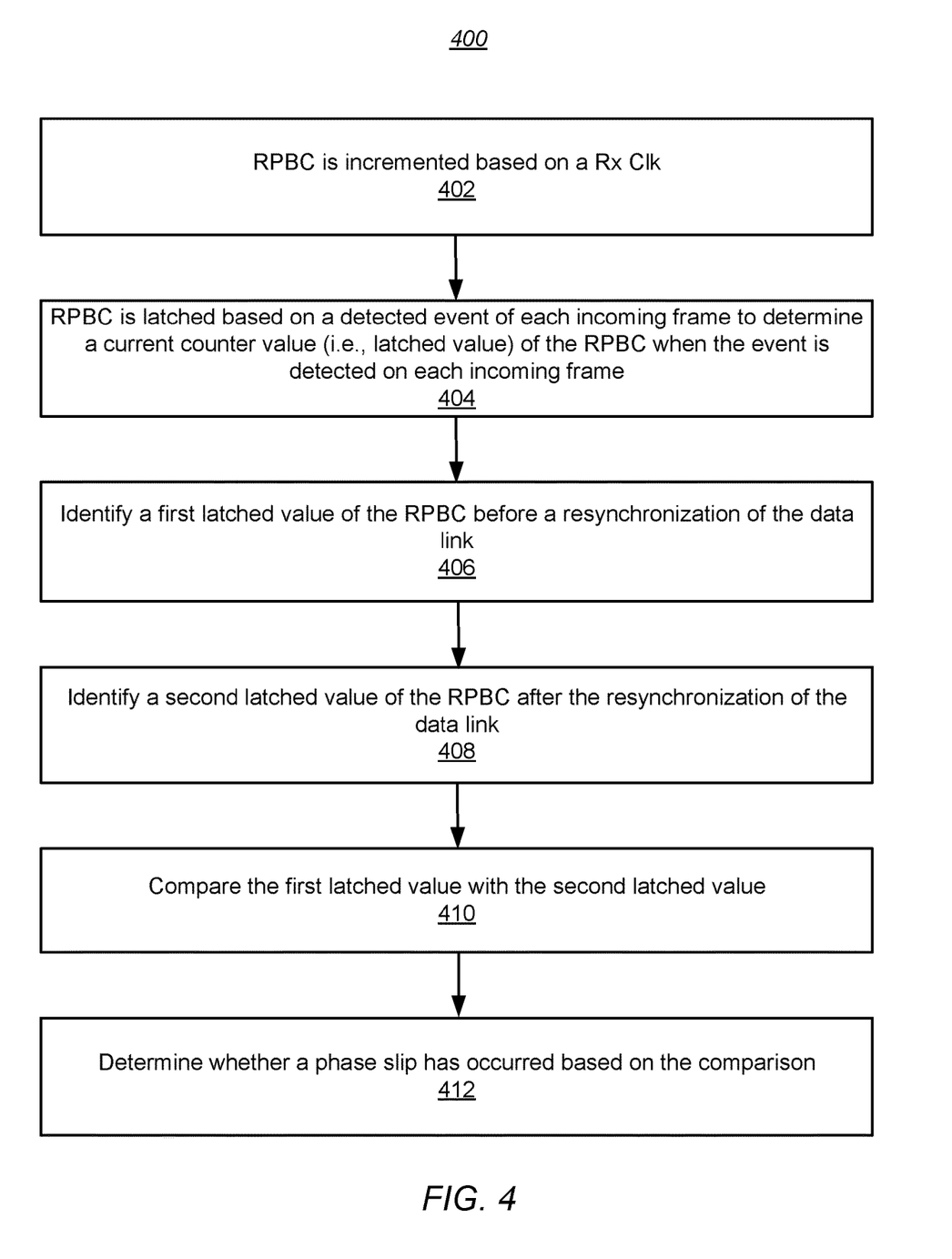
FIG. 4 illustrates an example method of slip detection on a serial data link using a reference phase bit counter, according to an example of the disclosure.

FIG. 4 illustrates an example method 400 of slip detection on a serial data link using a latched reference counter, according to an example of the disclosure. Although the method 400 is primarily described as being performed by apparatus 100 as shown in FIGS. 1A and 1B, the method 400 may be executed or otherwise performed by other systems, or a combination of systems. Each block shown in FIG. 4 may further represent one or more processes, methods, or subroutines, and one or more of the blocks may include machine-readable instructions stored on a non-transitory computer readable medium and executed by a processor or other type of processing circuit to perform one or more operations described herein.

At 402, the RPBC 114 is incremented according to the Rx Clk. For example, the RPBC may be incremented based on received bits on an incoming signal and is not incremented based on synchronization with frames of the incoming signal. For example, the RPBC 114 is incremented according to Rx Clk, such as shown in FIGS. 1-3.

At 404, the RPBC 114 is latched based on a detected event of each incoming frame to determine a current counter value (i.e., latched value) of the RPBC 114, when the event is detected on each incoming frame. For instance, a value of the RPBC 114 may be associated with a frame event that is detected from the incoming signal of the data link 102. More particularly, the detected event in each incoming frame may be detection of a leading bit of an incoming data frame (or other bit position of the data frame so long as the latching is consistently performed for each incoming data frame). The latched value of the RPBC 114 may therefore be synchronized with the same detected event for each incoming data frame even though the counter of the RPBC 114 is driven by the Rx Clk.

At 406, the apparatus 100 may identify a first latched value (such as RPBC_A illustrated in FIGS. 2 and 3) of the RPBC 114 before a resynchronization of the data link.

At 408, the apparatus 100 may identify a second latched value (such as RPBC_B illustrated in FIGS. 2 and 3) of the RPBC 114 after the resynchronization of the data link.

At 410, the apparatus 100 may compare the first latched value (RPBC_A) with the second latched value (RPBC_B). For example, the apparatus 100 may perform a signed integer arithmetic operation on the first latched value (RPBC_A) and the second latched value (RPBC_B) to determine a RPBC delta value, according to equation (1):

$$RPBC\_delta = RPBC\_B - RPBC\_A \qquad (1).$$

At 412, the apparatus 100 may determine whether a phase slip has occurred based on the comparison. For example, if RPBC_delta is non-zero, then the apparatus 100 may determine that a phase slip occurred. In some examples, the apparatus 100 may determine a size of the slip based on an absolute value of the RPBC_delta value. In some examples, the apparatus 100 may determine a direction of the slip based on a sign of the RPBC_delta value. For example, if RPBC_delta is negative (less than zero), then the apparatus 100 may determine that the frame slipped reverse in time (loss of one or more bits). On the other hand, if RPBC_delta is positive (greater than zero), then the apparatus 100 may determine that the frame slipped forward in time (gain of one or more bits).

Figure 5:
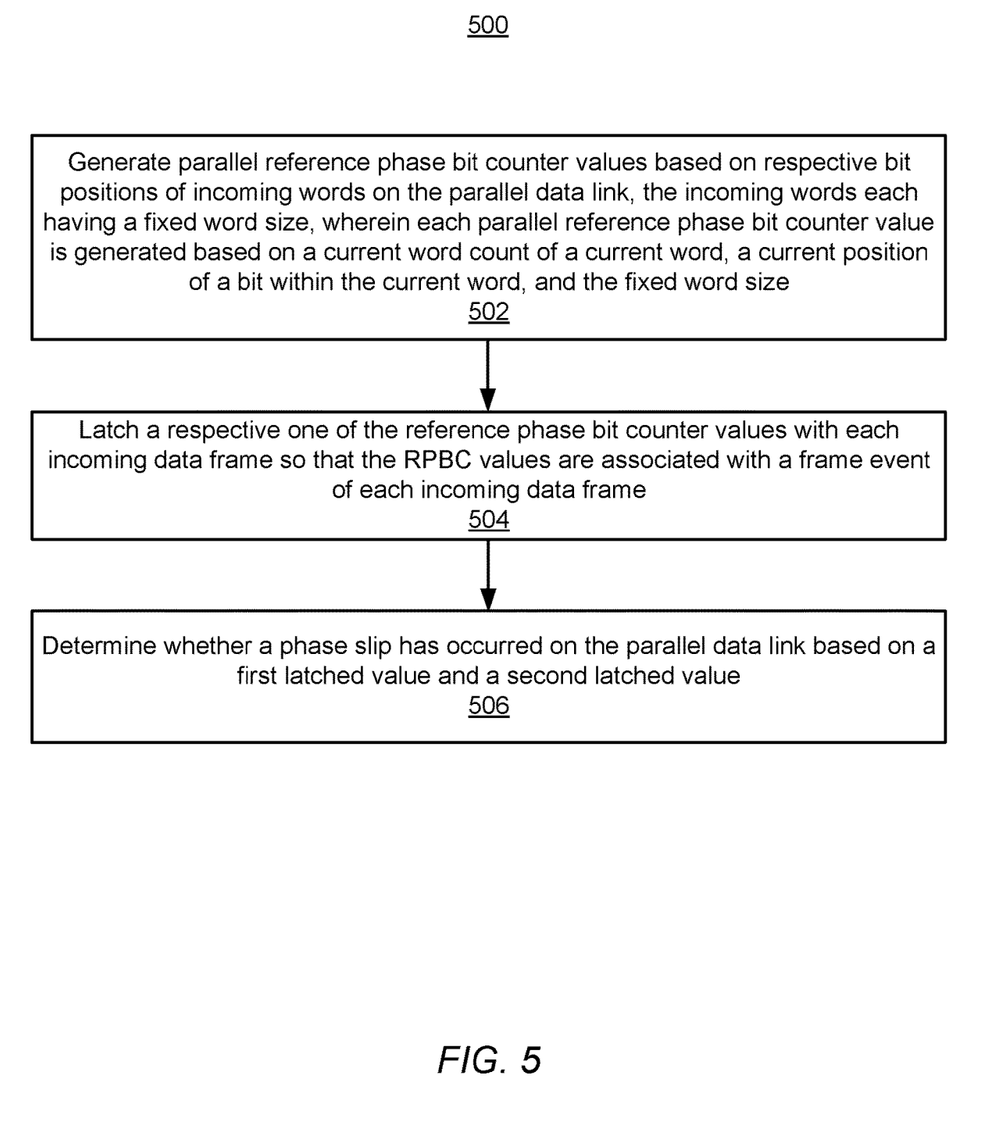
FIG. 5 illustrates an example method of slip detection on a parallel data link using a reference phase bit counter, according to an example of the disclosure.

FIG. 5 illustrates an example method 500 of slip detection on a parallel data link using a reference phase bit counter, according to an example of the disclosure. Although the method 500 is primarily described as being performed by apparatus 100B as shown in FIG. 1B, the method 500 may be executed or otherwise performed by other systems, or a combination of systems. Each block shown in FIG. 5 may further represent one or more processes, methods, or subroutines, and one or more of the blocks may include machine-readable instructions stored on a non-transitory computer readable medium and executed by a processor or other type of processing circuit to perform one or more operations described herein. FIG. 5 will be described with reference to FIG. 6, which illustrates a block diagram 600 of generating a RPBC value for a parallel data link.

Figure 6:
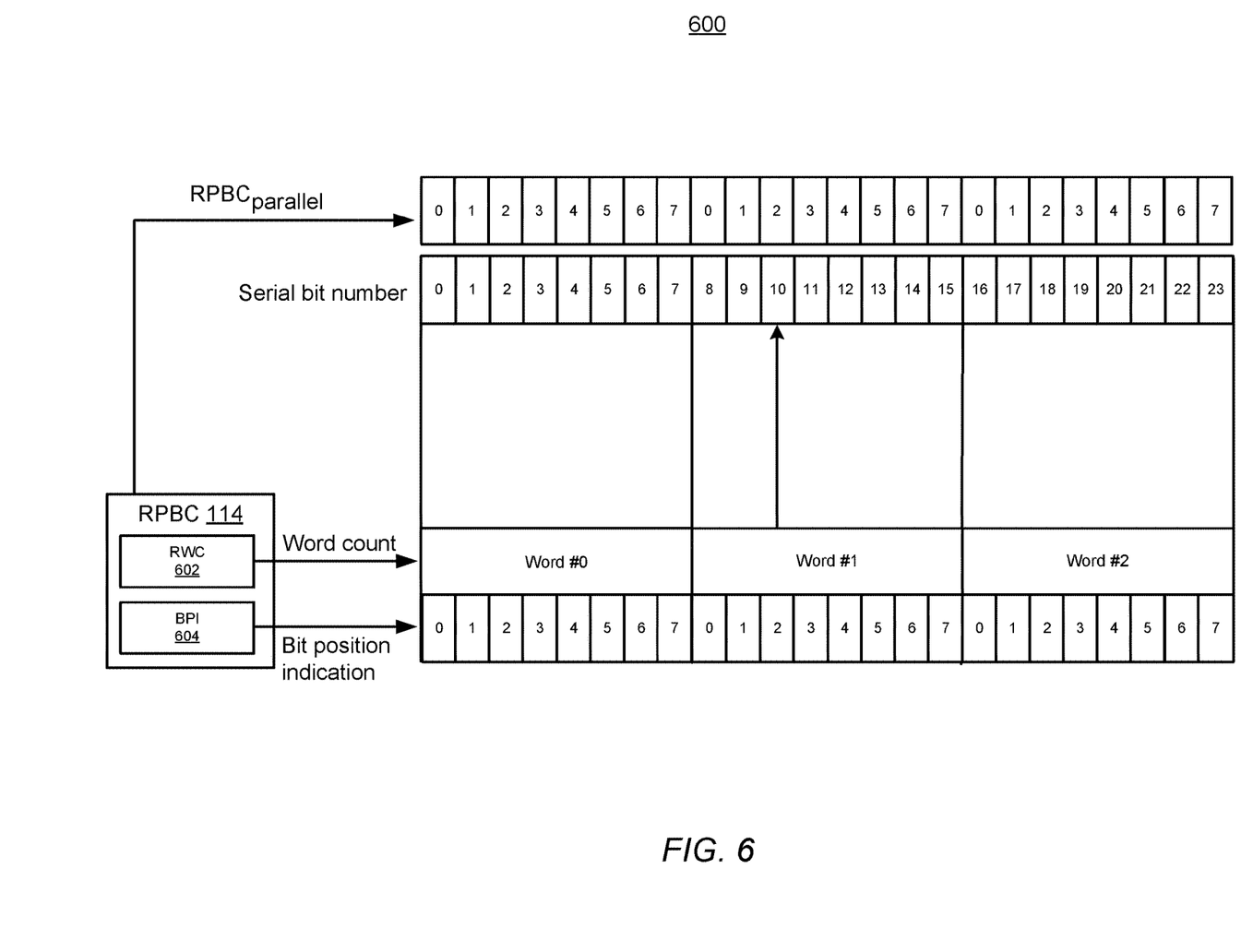
FIG. 6 illustrates an example method of generating a reference phase bit counter value for a parallel data link, according to an example of the disclosure.

At 502, the apparatus 100B may generate parallel RPBC values (RPBC$_{parallel}$) based on respective bit positions of incoming words on the parallel data link, the incoming words each having a fixed word size, wherein each parallel RPBC value is generated based on a current word count of a current word, a current position of a bit within the current word, and the fixed word size. For example, as illustrated in FIG. 6, in parallel processing examples, the RPBC 114 may include a reference word counter (RWC) 602 and a bit position indicator (BPI) 604. The RWC 602 and the BPI 604 may each be implemented as a semiconductor-based microprocessor, a central processing unit (CPU), an application processor specific integrated circuit (ASIC), a field-programmable gate array (FPGA), and/or other suitable hardware device.

The RWC 602 may count, starting at zero for the first word, incoming words of the incoming parallel signal. The BPI 604 may indicate a bit position within a word at which a frame begins. For example, the BPI 604 may include a barrel shifter that positions the frame at a bit position within the word and indicates the bit position within the word where the frame starts. The range of bit position values output by the BPI 604 to indicate the start of a frame within a word may range from 0 (zero) for the first bit position in the word to N−1 for the last bit position in the word. The value of the BPI 604 may be updated as the incoming parallel signal is framed by the BPI 604. The RPBC 114 may determine a serial bit given bit position with respect to a frame based on the word count (RWC), size of the word (N), and bit position within the word (BitPos) according to equation (2):

$$RPBC_{parallel}=(N\times RWC)+BitPos \quad (2).$$

As previously noted, the RPBC 114 may wrap based on the frame size. Thus, referring to FIG. 6, for "Word #1", if the BPI 604 indicates that a frame starts at bit position 2, the word size is 8, and the RWC 602 is 1, then the serial bit number may be 10, indicating that the bit position of the frame is at serial bit number 10. Because the RPBC 114 may wrap based on the frame size (for example, 8), the RPBC$_{parallel}$ value for the start of the frame at Word #1 is wrapped to 2.

At 504, the apparatus 100B may latch a respective one of the RPBC values with each incoming data frame so that the RPBC values are associated with a frame event of each incoming data frame.

At 506, the apparatus 100B may determine whether a phase slip has occurred on the parallel data link based on a first latched value and a second latched value. The RPBC$_{parallel}$ values may be latched and used to determine whether a phase slippage has occurred and a size and direction of any such slippage on a parallel data link, similar to the manner described with respect to FIG. 4. For instance, each lane in a parallel data link may be associated with a corresponding RPBC 114 that latches RPBC$_{parallel}$ values.

Figure 7:
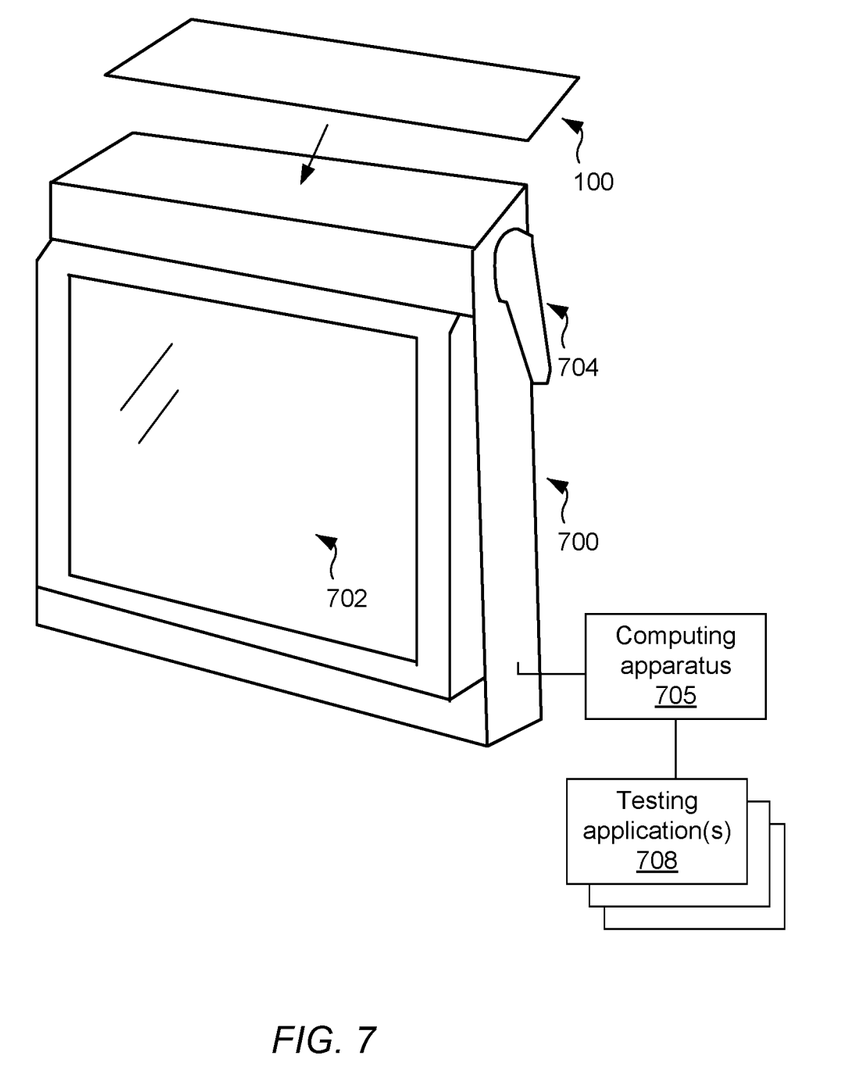
FIG. 7 illustrates a testing system with which an apparatus may be combined, according to an example of the disclosure.

FIG. 7 illustrates a testing system 700 with which an apparatus 100 may be combined, according to an example of the disclosure. For example, portions or all of the apparatus 100 may be removably or integrally combined. The particular manner of combination as illustrated is for illustration and not limitation. Other ways to combine the apparatus 100 with the testing system 700 may be used as well, including both wired and wireless combinations.

The testing system 700 may have a display 702, a handle 704, a computing apparatus 706, one or more testing applications 708, and/or other components. In examples that include the handle 704, the testing system 700 may be generally portable so that that the testing system 700 may be carried to different test locations. The display 702 may provide one or more graphical user interfaces (GUIs) generated by the apparatus 100 and/or other components of the testing system 700. The GUIs generated by the apparatus 100 may include indications of any of the determinations made by the apparatus. For example, the GUIs may display an indication of each lane's status depicting whether, by how much, the direction of a phase slip, a total count of slips, a timestamped list of slip events, a minimum/maximum/average time between slips, a slip probability per unit time (such as per hour), and/or other data based slips detected as described herein. In some examples, the GUIs may be used to display recommended actions in response to detected phase slips, including any potential remedial responses.

The computing apparatus 706 may include a processor (not shown) similar to the controller 120, and data storage (not shown) similar to data storage 122. The computing apparatus 706 may store and execute one or more testing applications 708, which may be added and removed from the testing system 700. As such, the testing system 700 may provide a configurable testing platform for testing, data links such as data link 102.

In some examples, the data link 102 may include one or more lanes. In examples having a plurality of lanes, the apparatus 100 may include a respective RPBC 114 for each lane. In some examples, the data link 102 includes a serial link. In other examples, the data link 102 includes a parallel link. In some examples, the manner in which the RPBC operates may be based on whether the data link 102 is bit-serial or parallel. For example, for parallel examples, the RPBC 114 may include a reference word count component and a bit position count component to generate counter values, as will be described with reference to FIG. 6.

Examples and examples are described above, and those skilled in the art will be able to make various modifications to the described examples and examples without departing from the scope of the examples and examples.

What is claimed is:

1. A test instrument to detect phase slips on a data link, the test instrument comprising:
   an interface to couple to the data link to receive an incoming signal transmitted on the data link, wherein the incoming signal includes frames;
   a reference phase bit counter (RPBC) incremented based on a recovered clock signal that is recovered from the incoming signal,
     wherein the RPBC wraps based on a frame size of the frames in the incoming signal, and
     wherein the RPBC is latched responsive to a frame event detected for each of the frames in the incoming signal;
   a frame synchronization state machine (FSSM) to resynchronize a frame in the incoming signal;
   a controller to:
     determine a first latched value of the RPBC before the resynchronization;
     determine a second latched value of the RPBC after the resynchronization;
     compare the first latched value with the second latched value; and
     determine whether a phase slip has occurred based on the comparison.

2. The test instrument of claim 1, wherein to compare the first latched value and the second latched value, the controller is to:

generate a delta between the first latched value and the second latched value.

3. The test instrument of claim 2, wherein the controller is further to:
quantify a size of a slippage based on an absolute value of the delta.

4. The test instrument of claim 3, wherein the controller is further to:
determine a direction of the slippage based on a sign of the delta.

5. The test instrument of claim 4, wherein the controller is further to:
determine that the delta is negative; and
determine that the direction of the slippage is reverse.

6. The test instrument of claim 4, wherein the controller is further to:
determine that the delta is positive; and
determine that the direction of the slippage is forward.

7. The test instrument of claim 3, wherein the controller is further to:
determine that the delta between the second latched value and the first latched value is zero; and
determine that no slippage has occurred based on the determination that the delta between the second latched value and the first latched is zero.

8. The test instrument of claim 1, wherein the data link comprises a multi-lane data link comprising a first lane and a second lane, the RPBC operates on the first lane, and the test instrument comprises a second RPBC for the second lane.

9. The test instrument of claim 1, further comprising:
a clock recovery circuit to generate a recovered clock signal from the incoming signal.

10. The test instrument of claim 1, further comprising:
a frame event detector to detect a frame event of each of the frames in the incoming signal and cause the RPBC to be latched to each frame based on the frame event detection.

11. The test instrument of claim 1, wherein to compare the first latched value and the second latched value, the controller is further to:
process a signed integer arithmetic operation on the first latched value and the second latched value based on the frame size.

12. A test instrument to detect a phase slip on a parallel data link, comprising:
an interface to couple to the parallel data link; and
a reference phase bit counter (RPBC) to:
increment RPBC values based on respective bit positions of incoming words on the parallel data link, the incoming words each having a fixed word size, wherein each RPBC value is generated based on a current word count of a current word, a current position of a bit within the current word, and the fixed word size; and
a controller to:
latch a respective one of the RPBC values responsive to a detected event of each incoming data frame; and
determine whether a phase slip has occurred on the parallel data link based on a first latched value and a second latched value of the RPBC values.

13. The test instrument of claim 12, wherein the detected event of each incoming data frame comprises detection of a leading bit of the incoming data frame.

14. The test instrument of claim 12, wherein the RPBC is further to:
wrap the RPBC values based on a size of an incoming data frame.

15. The test instrument of claim 14, wherein to determine whether the phase slip has occurred, the controller is further to:
obtain a first latched value of the RPBC, the first latched value being a latched value prior to a resynchronization of a lane;
obtain a second latched value of the RPBC, the second latched value being a latched value after the resynchronization of the lane; and
generate a delta value based on a signed integer arithmetic operation on the first latched value and the second latched value, wherein the determination of whether the phase slip occurred is based on the delta value.

16. The test instrument of claim 15, wherein the controller is further to:
determine that the delta value is non-zero; and
determine that the phase slip occurred based on the determination that the delta value is non-zero.

17. The test instrument of claim 16, wherein the controller is further to:
determine a size of the phase slip based on an absolute value of the delta value.

18. The test instrument of claim 17, wherein the controller is further to:
determine that the delta value is negative; and
determine that the phase slip is reverse based on the determination that the delta value is negative.

19. The test instrument of claim 17, wherein the controller is further to:
determine that the delta value is positive; and
determine that the phase slip is forward based on the determination that the delta value is positive.

20. A method, comprising:
incrementing a reference phase bit counter (RPBC) based on a recovered receiver clock for an incoming signal, wherein the RPBC wraps based on a size of each frame in the incoming signal;
latching the RPBC based on a frame event of each frame in the incoming signal to determine a counter value of the RPBC when the frame event is detected;
determining a first latched value of the RPBC before a resynchronization of the incoming signal;
determining a second latched value of the RPBC after the resynchronization; comparing the first latched value with the second latched value; and
determining whether a phase slip has occurred based on the comparison.

* * * * *